(12) United States Patent
Yamamura

(10) Patent No.: US 12,526,921 B2
(45) Date of Patent: Jan. 13, 2026

(54) WIRING BOARD

(71) Applicant: SHINKO ELECTRIC INDUSTRIES CO., LTD., Nagano (JP)

(72) Inventor: Kyota Yamamura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 175 days.

(21) Appl. No.: 18/540,013

(22) Filed: Dec. 14, 2023

(65) Prior Publication Data

US 2024/0215164 A1 Jun. 27, 2024

(30) Foreign Application Priority Data

Dec. 27, 2022 (JP) ................................. 2022-209741

(51) Int. Cl.
| | |
|---|---|
| H05K 1/11 | (2006.01) |
| H01L 23/498 | (2006.01) |
| H05K 3/10 | (2006.01) |
| H05K 3/18 | (2006.01) |
| H05K 3/46 | (2006.01) |

(52) U.S. Cl.
CPC ........ *H05K 1/113* (2013.01); *H01L 23/49822* (2013.01); *H05K 3/108* (2013.01); *H05K 3/18* (2013.01); *H05K 3/4644* (2013.01); *H05K 2201/09481* (2013.01); *H05K 2201/096* (2013.01); *H05K 2203/0723* (2013.01)

(58) Field of Classification Search
CPC .......... H05K 1/113; H05K 3/108; H05K 3/18; H05K 3/4644; H01L 23/49822
USPC ........................................................ 174/264
See application file for complete search history.

(56) References Cited

U.S. PATENT DOCUMENTS

| | | | | |
|---|---|---|---|---|
| 2010/0163293 | A1* | 7/2010 | Kawai | H05K 3/4682 |
| | | | | 29/850 |
| 2014/0360760 | A1* | 12/2014 | Kiwanami | H05K 3/4697 |
| | | | | 174/251 |
| 2017/0150603 | A1* | 5/2017 | Yamamura | H05K 3/421 |
| 2023/0258893 | A1* | 8/2023 | Okawa | H05K 1/0274 |
| | | | | 385/14 |

FOREIGN PATENT DOCUMENTS

JP 2017-098422 6/2017

* cited by examiner

*Primary Examiner* — Andargie M Aychillhum
(74) *Attorney, Agent, or Firm* — IPUSA, PLLC

(57) ABSTRACT

A wiring board includes a first interconnect layer, an insulating layer covering the first interconnect layer, a via interconnect penetrating the insulating layer, and a second interconnect layer provided on an upper surface of the insulating layer and electrically connected to the first interconnect layer through the via interconnect. The via interconnect includes a first seed layer that covers an inner wall surface of a via hole penetrating the insulating layer, and an upper surface of the first interconnect layer exposed inside the via hole, and a first electrolytic plating layer provided on the first seed layer. The second interconnect layer includes a second seed layer provided on the upper surface of the insulating layer and on an upper surface of the first electrolytic plating layer, and a second electrolytic plating layer provided on the second seed layer.

9 Claims, 10 Drawing Sheets

WIRING BOARD

CROSS-REFERENCE TO RELATED APPLICATIONS

This application is based upon and claims priority to Japanese Patent Application No. 2022-209741, filed on Dec. 27, 2022, the entire contents of which are incorporated herein by reference.

FIELD

Certain aspects of the embodiments discussed herein are related to wiring boards and methods for manufacturing wiring boards.

BACKGROUND

A known multilayer wiring board includes interconnect layers and insulating layers that are alternately laminated. In such a wiring board, adjacent interconnect layers are electrically connected through via interconnects penetrating the insulating layer that is interposed between the adjacent interconnect layers. In addition, the via interconnects and the interconnect formed thereon are integrally formed by a single plating process, for example. That is, the single plating process includes a process of filling via holes formed in the insulating layer with a conductor, and a process of forming the conductor on an upper surface of the insulating layer to form the interconnect layer. An example of such a single plating process is proposed in Japanese Laid-Open Patent Publication No. 2017-98422, for example.

However, because the via holes cannot be filled with the conductor unless the conductor, formed on the upper surface of the insulating layer to form the interconnect layer, is formed to a predetermined thickness or greater, the thickness of the interconnect layer cannot be designed with a large degree of freedom in a case where the process of filling the via holes and the process of forming the interconnect layer are to be performed simultaneously. That is, a design freedom of the thickness of the interconnect layer is small.

SUMMARY

Accordingly, it is an object in one aspect of the embodiments to provide a wiring board that can improve a design freedom of a thickness of an interconnect layer.

According to one aspect of the embodiments, a wiring board includes a first interconnect layer; an insulating layer covering the first interconnect layer; a via interconnect penetrating the insulating layer; and a second interconnect layer provided on an upper surface of the insulating layer and electrically connected to the first interconnect layer through the via interconnect, wherein the via interconnect includes a first seed layer that covers an inner wall surface of a via hole penetrating the insulating layer, and an upper surface of the first interconnect layer exposed inside the via hole, and a first electrolytic plating layer provided on the first seed layer, and the second interconnect layer includes a second seed layer provided on the upper surface of the insulating layer and on an upper surface of the first electrolytic plating layer, and a second electrolytic plating layer provided on the second seed layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
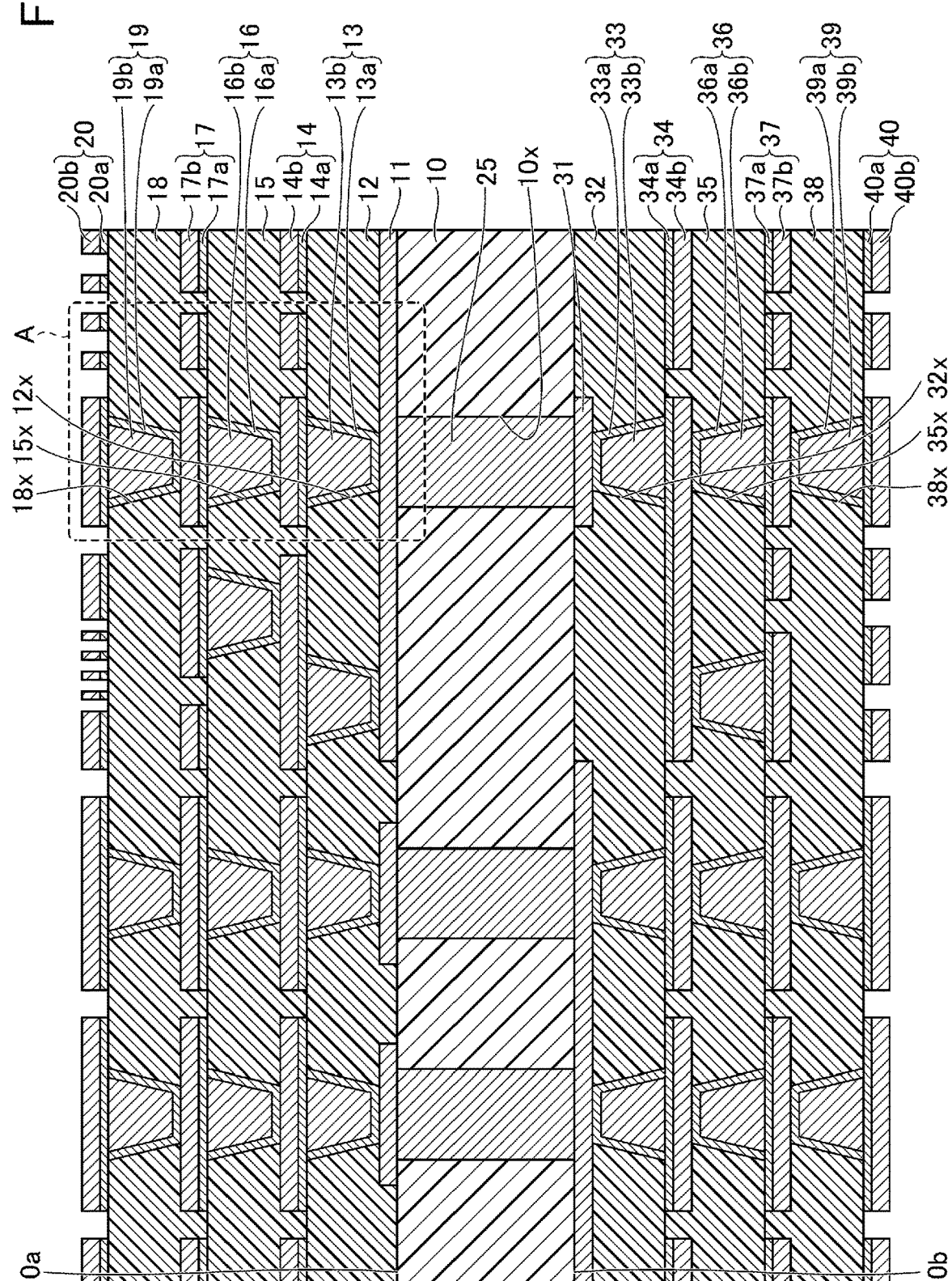
FIG. 1 is a cross sectional view illustrating an example of a wiring board according to a first embodiment.

Preferred embodiments of the present invention will be described with reference to the accompanying drawings. In the drawings, those constituent elements that are the same are designated by the same reference numerals, and a repeated description of the same constituent elements may be omitted.

First Embodiment

[Configuration of Wiring Board]

FIG. 1 is a cross sectional view illustrating an example of a wiring board according to a first embodiment. As illustrated in FIG. 1, a wiring board 1 includes interconnect layers and insulating layers that are laminated on opposite surfaces of a core substrate 10.

More particularly, in the wiring board 1, an interconnect layer 11, an insulating layer 12, a via interconnect 13, an interconnect layer 14, an insulating layer 15, a via interconnect 16, an interconnect layer 17, an insulating layer 18, a via interconnect 19, and an interconnect layer 20 are successively laminated on an upper surface 10a of the core substrate 10. In addition, an interconnect layer 31 an insulating layer 32, a via interconnect 33, an interconnect layer 34, an insulating layer 35, a via interconnect 36, an interconnect layer 37, an insulating layer 38, a via interconnect 39, and an interconnect layer 40 are successively laminated on a lower surface 10b of the core substrate 10.

In the present embodiment, for the sake of convenience, the side of the interconnect layer 20 of the wiring board 1 illustrated in FIG. 1 is also referred to as "an upper side" or "one side", and the side of the interconnect layer 40 of the wiring board 1 is also referred to as "a lower side" or "the other side". In addition, the surface of each portion on the side of the interconnect layer 20 is referred to as "an upper surface" or "one surface", and the surface of each portion on the side of the interconnect layer 40 is referred to as "a lower surface" or "the other surface". However, the wiring board 1 may be used in an upside-down state, or at an inclined state inclined at an arbitrary angle. Moreover, a plan view of an object refers to a view of the object viewed from above in a normal direction to one surface of the interconnect layer 20, and a planar shape of the object refers to a shape of the object in the plan view viewed from above in the normal direction to the one surface of the interconnect layer 20.

The core substrate 10 may be a so-called glass epoxy substrate or the like having a glass cloth impregnated with a thermosetting insulating resin, such as an epoxy-based resin or the like, for example. The core substrate 10 may be a substrate having a woven or nonwoven fabric of glass fiber, carbon fiber, aramid fiber, or the like impregnated with a thermosetting insulating resin, such as an epoxy-based resin or the like. A thickness of the core substrate 10 may be in a range of approximately 80 µm to approximately 1200 µm, for example. In each of the drawings, the illustration of the glass cloth or the like is omitted.

A plurality of through holes 10x penetrating the core substrate 10 are formed in the core substrate 10. A planar shape of the through holes 10x may be a circular shape having a diameter in a range of approximately 50 µm to approximately 100 µm, for example. A pitch of the through holes 10x may be in a range of approximately 100 µm to approximately 1000 µm, for example. A via electrode (through via or feedthrough electrode) 25 is formed inside the through hole 10x. A material used for the via electrode 25 may be copper (Cu) or the like, for example.

The interconnect layer 11 may be an interconnect pattern formed on the upper surface 10a of the core substrate 10. The interconnect layer 31 may be an interconnect pattern formed on the lower surface 10b of the core substrate 10. The interconnect layer 11 is electrically connected to the interconnect layer 31 through the via electrodes 25 that penetrates the core substrate 10. The interconnect layer 11 and the interconnect layer 31 are formed of a metal foil, such as a copper foil or the like, or a plating layer, such as a copper plating layer or the like, for example. A thickness of each of the interconnect layer 11 and the interconnect layer 31 may be in a range of approximately 15 µm to approximately 35 µm, for example. A line-and-space (L/S) of each of the interconnect layer 11 and the interconnect layer 31 may be in a range of approximately 10 µm/10 µm to approximately 50 µm/50 µm, for example.

In the line-and-space, the line represents an interconnect width, and the space represents an interval between adjacent interconnects (interconnect spacing). In a case where the line-and-space is in a range of 10 µm/10 µm to 50 µm/50 µm, the interconnect width is in a range greater than or equal to 10 µm and less than or equal to 50 µm, and the interconnect spacing between the adjacent interconnects is in a range greater than or equal to 10 µm and less than or equal to 50 µm. The interconnect width and the interconnect spacing does not necessarily have to be the same.

The insulating layer 12 is formed on the upper surface 10a of the core substrate 10, so as to cover the interconnect layer 11. The insulating layer 32 is formed on the lower surface 10b of the core substrate 10, so as to cover the interconnect layer 31. The insulating layer 12 and the insulating layer 32 are insulating layers including a non-photosensitive resin as a main component thereof, for example. The insulating layer 12 and the insulating layer 32 may include a thermosetting non-photosensitive resin, such as an epoxy-based resin, an imide-based resin, a phenol-based resin, a cyanate-based resin, or the like as the main component thereof, for example. A thickness of each of the insulating layer 12 and the insulating layer 32 may be in a range of approximately 20 µm to approximately 40 µm, for example. The insulating layer 12 and the insulating layer 32 may include a filler, such as silica ($SiO_2$) or the like. The insulating layer 12 and the insulating layer 32 may be insulating layers including a photosensitive resin as a main component thereof, for example.

The via interconnect 13 fills an inside of a via hole 12x that penetrates the insulating layer 12 and exposes an upper surface of the interconnect layer 11. The via hole 12x may be a cavity having an inverted truncated cone shape, and a diameter of a first opening of the cavity at one end which opens toward the insulating layer 15 is greater than a diameter of a second opening of the cavity at the other end, at a bottom surface of the cavity, formed by the upper surface of the interconnect layer 11. The via interconnect 13 includes a seed layer 13a continuously covering an inner wall surface of the via hole 12x and the upper surface of the interconnect layer 11 exposed inside the via hole 12x, and an electrolytic plating layer 13b provided above the seed layer 13a. An opening of the via hole 12x may have a diameter in a range of approximately 50 µm to approximately 80 µm, for example.

The via interconnect 33 fills an inside of the via hole 32x that penetrates the insulating layer 32 and exposes a lower surface of the interconnect layer 31. The via hole 32x may be a cavity having a truncated cone shape, and a diameter of a first opening of the cavity at one end which opens toward the insulating layer 35 is greater than a diameter of a second opening of the cavity at the other end, at a bottom surface of the cavity, formed by the lower surface of the interconnect layer 31. The via interconnect 33 includes a seed layer 33a continuously covering an inner wall surface of the via hole 32x and the lower surface of the interconnect layer 31 exposed inside the via hole 32x, and an electrolytic plating layer 33b provided below the seed layer 33a. An opening of the via hole 32x may have a diameter in a range of approximately 50 µm to approximately 80 µm, for example.

An end surface of the seed layer 13a is exposed at an upper surface of the insulating layer 12. The end surface of the seed layer 13a and an upper surface of the electrolytic plating layer 13b coincide with the upper surface of the insulating layer 12, for example. An end surface of the seed layer 33a is exposed at a lower surface of the insulating layer 32. The end surface of the seed layer 33a and a lower surface of the electrolytic plating layer 33b coincide with the lower surface of the insulating layer 32, for example. The seed layers 13a and 33a may be formed of copper, for example. A thickness of each of the seed layers 13a and 33a may be in a range of approximately 200 nm to approximately 400 nm, for example. The electrolytic plating layers 13b and 33b may be formed of copper, for example. A thickness of each of the electrolytic plating layers 13b and 33b may be in a range of approximately 20 µm to approximately 40 µm, for example.

The interconnect layer 14 is provided on the upper surface of the insulating layer 12, and is electrically connected to the interconnect layer 11 through the via interconnects 13 penetrating the insulating layer 12. A thickness of the interconnect layer 14 may be 10 µm or less, for example. The thickness of the interconnect layer 14 may be greater than 10 µm. The interconnect layer 14 includes pads located on the via interconnects 13, and an interconnect pattern located on the upper surface of the insulating layer 12. A line-and-space of the interconnect pattern located on the upper surface of the insulating layer 12 may be in a range of approximately 10 µm/10 µm to approximately 50 µm/50 µm, for example. The interconnect layer 14 includes a seed layer 14a formed on the upper surface of the insulating layer 12 and the upper surface of the electrolytic plating layer 13b, and an electrolytic plating layer 14b provided on the seed layer 14a. In the pad located on the via interconnect 13, a lower surface of the seed layer 14a is connected to the end surface of the seed layer 13a.

The interconnect layer 34 is provided on the lower surface of the insulating layer 32, and is electrically connected to the interconnect layer 31 through the via interconnects 33 penetrating the insulating layer 32. A thickness of the interconnect layer 34 may be 10 µm or less, for example. The thickness of the interconnect layer 34 may be greater than 10 µm. The interconnect layer 34 includes pads located under the via interconnects 33, and an interconnect pattern located on the lower surface of the insulating layer 32. A line-and-space of the interconnect pattern located on the lower surface of the insulating layer 32 may be in a range of approximately 10 µm/10 µm to approximately 50 µm/50 µm, for example. The interconnect layer 34 includes a seed layer 34a formed on the lower surface of the insulating layer 32 and the lower surface of the electrolytic plating layer 33b, and an electrolytic plating layer 34b provided under the seed layer 34a. In the pad located under the via interconnect 33, an upper surface of the seed layer 34a is connected to the end surface of the seed layer 33a.

The seed layers 14a and 34a may be formed of copper, for example. A thickness of each of the seed layers 14a and 34a may be in a range of approximately 200 nm to approximately 400 nm, for example. The electrolytic plating layers 14b and 34b may be formed of copper, for example. A thickness of each of the electrolytic plating layers 14b and 34b may be in a range of approximately 1 µm to approximately 20 µm, for example.

The insulating layer 15 is formed on the upper surface of the insulating layer 12, so as to cover the interconnect layer 14. The insulating layer 35 is formed on the lower surface of the insulating layer 32, so as to cover the interconnect layer 34. A material used for the insulating layer 15 and the insulating layer 35 and a thickness of the insulating layer 15 and the insulating layer 35 may be the same as those of the insulating layer 12 and the insulating layer 32, for example. The insulating layer 15 and the insulating layer 35 may include a filler, such as silica ($SiO_2$) or the like.

The via interconnect 16 fills an inside of a via hole 15x that penetrates the insulating layer 15 and exposes an upper surface of the interconnect layer 14. The via hole 15x may be a cavity having an inverted truncated cone shape, and a diameter of a first opening of the cavity at one end which opens toward the insulating layer 18 is greater than a diameter of a second opening of the cavity at the other end, at a bottom surface of the cavity, formed by the upper surface of the interconnect layer 14. The via interconnect 16 includes a seed layer 16a continuously covering an inner wall surface of the via hole 15x and the upper surface of the interconnect layer 14 exposed inside the via hole 15x, and an electrolytic plating layer 16b provided above the seed layer 16a. An opening of the via hole 15x may have a diameter in a range of approximately 50 µm to approximately 80 µm, for example.

The via interconnect 36 fills an inside of a via hole 35x that penetrates the insulating layer 35 and exposes a lower surface of the interconnect layer 34. The via hole 35x may be a cavity having a truncated cone shape, and a diameter of a first opening of the cavity at one end which opens toward the insulating layer 38 is greater than a diameter of a second opening of the cavity at the other end, at a bottom surface of the cavity, formed by the lower surface of the interconnect layer 34. The via interconnect 36 includes a seed layer 36a continuously covering an inner wall surface of the via hole 35x and the lower surface of the interconnect layer 34 exposed inside the via hole 35x, and an electrolytic plating layer 36b provided below the seed layer 36a. An opening of the via hole 35x may have a diameter in a range of approximately 50 µm to approximately 80 µm, for example.

An end surface of the seed layer 16a is exposed at an upper surface of the insulating layer 15. The end surface of the seed layer 16a and an upper surface of the electrolytic plating layer 16b coincide with the upper surface of the insulating layer 15, for example. An end surface of the seed layer 36a is exposed at a lower surface of the insulating layer 35. The end surface of the seed layer 36a and a lower surface of the electrolytic plating layer 36b coincide with the lower surface of the insulating layer 35, for example. A material used for the seed layers 16a and 36a and a thickness of the seed layers 16a and 36a may be the same as those of the seed layers 13a and 33a, for example. A material used for the electrolytic plating layers 16b and 36b and a thickness of the electrolytic plating layers 16b and 36b may be the same as those of the electrolytic plating layers 13b and 33b, for example.

The interconnect layer 17 is provided on the upper surface of the insulating layer 15, and is electrically connected to the interconnect layer 14 through the via interconnects 16 penetrating the insulating layer 15. A thickness of the interconnect layer 17 may be 10 µm or less, for example. The thickness of the interconnect layer 17 may be greater than 10 µm. The interconnect layer 17 includes pads located on the via interconnects 16, and an interconnect pattern located on the upper surface of the insulating layer 15. A line-and-space of the interconnect pattern located on the upper surface of the insulating layer 15 may be in a range of approximately 10 µm/10 µm to approximately 50 µm/50 µm, for example. The interconnect layer 17 includes a seed layer 17a formed on the upper surface of the insulating layer 15 and the upper surface of the electrolytic plating layer 16b, and an electrolytic plating layer 17b provided on the seed layer 17a. In the pad located on the via interconnect 16, a lower surface of the seed layer 17a is connected to the end surface of the seed layer 16a.

The interconnect layer 37 is provided on the lower surface of the insulating layer 35, and is electrically connected to the interconnect layer 34 through the via interconnects 36 penetrating the insulating layer 35. A thickness of the interconnect layer 37 may be 10 µm or less, for example. The thickness of the interconnect layer 37 may be greater than 10 µm. The interconnect layer 37 includes pads located under the via interconnects 36, and an interconnect pattern located on the lower surface of the insulating layer 35. A line-and-space of the interconnect pattern located on the lower surface of the insulating layer 35 may be in a range of approximately 10 µm/10 µm to approximately 50 µm/50 µm, for example. The interconnect layer 37 includes a seed layer 37a formed on the lower surface of the insulating layer 35 and the lower surface of the electrolytic plating layer 36b, and an electrolytic plating layer 37b provided under the seed layer 37a. In the pad located under the via interconnect 36, an upper surface of the seed layer 37a is connected to the end surface of the seed layer 36a.

A material used for the seed layers 17a and 37a and a thickness of the seed layers 17a and 37a may be the same as those of the seed layers 14a and 34a, for example. A material used for the electrolytic plating layers 17b and 37b and a thickness of the electrolytic plating layers 17b and 37b may be the same as those of the electrolytic plating layers 14b and 34b, for example.

The insulating layer 18 is formed on the upper surface of the insulating layer 15, so as to cover the interconnect layer 17. The insulating layer 38 is formed on the lower surface of the insulating layer 35, so as to cover the interconnect layer 37. A material used for the insulating layer 18 and the insulating layer 38 and a thickness of the insulating layer 18 and the insulating layer 38 may be the same as those of the insulating layer 15 and the insulating layer 35, for example. The insulating layer 18 and the insulating layer 38 may include a filler, such as silica ($SiO_2$) or the like.

The via interconnect 19 fills an inside of a via hole 18x that penetrates the insulating layer 18 and exposes an upper surface of the interconnect layer 17. The via hole 18x may be a cavity having an inverted truncated cone shape, and a diameter of a first opening of the cavity at one end which opens toward the interconnect layer 20 is greater than a diameter of a second opening of the cavity at the other end, at a bottom surface of the cavity, formed by the upper surface of the interconnect layer 17. The via interconnect 19 includes a seed layer 19a continuously covering an inner wall surface of the via hole 18x and the upper surface of the interconnect layer 17 exposed inside the via hole 18x, and an electrolytic plating layer 19b provided above the seed layer 19a. An opening of the via hole 18x may have a diameter in a range of approximately 50 μm to approximately 80 μm, for example.

The via interconnect 39 fills an inside of a via hole 38x that penetrates the insulating layer 38 and exposes a lower surface of the interconnect layer 37. The via hole 38x may be a cavity having a truncated cone shape, and a diameter of a first opening of the cavity at one end which opens toward the interconnect layer 40 is greater than a diameter of a second opening of the cavity at the other end, at a bottom surface of the cavity, formed by the lower surface of the interconnect layer 37. The via interconnect 39 includes a seed layer 39a continuously covering an inner wall surface of the via hole 38x and the lower surface of the interconnect layer 37 exposed inside the via hole 38x, and an electrolytic plating layer 39b provided below the seed layer 39a. An opening of the via hole 38x may have a diameter in a range of approximately 50 μm to approximately 80 μm, for example.

An end surface of the seed layer 19a is exposed at an upper surface of the insulating layer 18. The end surface of the seed layer 19a and an upper surface of the electrolytic plating layer 19b coincide with the upper surface of the insulating layer 18, for example. An end surface of the seed layer 39a is exposed at a lower surface of the insulating layer 38. The end surface of the seed layer 39a and a lower surface of the electrolytic plating layer 39b coincide with the lower surface of the insulating layer 38, for example. A material used for the seed layers 19a and 39a and a thickness of the seed layers 19a and 39a may be the same as those of the seed layers 13a and 33a, for example. A material used for the electrolytic plating layers 19b and 39b and a thickness of the electrolytic plating layers 19b and 39b may be the same as those of the electrolytic plating layers 13b and 33b, for example.

The interconnect layer 20 is provided on the upper surface of the insulating layer 18, and is electrically connected to the interconnect layer 17 through the via interconnects 19 penetrating the insulating layer 18. A thickness of the interconnect layer 20 may be 10 μm or less, for example. The thickness of the interconnect layer 20 may be greater than 10 μm. The interconnect layer 20 includes pads located on the via interconnects 19, and an interconnect pattern located on the upper surface of the insulating layer 18. A line-and-space of the interconnect pattern located on the upper surface of the insulating layer 18 may be in a range of approximately 10 μm/10 μm to approximately 50 μm/50 μm, for example. The interconnect layer 20 includes a seed layer 20a formed on the upper surface of the insulating layer 18 and the upper surface of the electrolytic plating layer 19b, and an electrolytic plating layer 20b provided on the seed layer 20a. In the pad located on the via interconnect 19, a lower surface of the seed layer 20a is connected to the end surface of the seed layer 19a.

The interconnect layer 40 is provided on the lower surface of the insulating layer 38, and is electrically connected to the interconnect layer 37 through the via interconnects 39 penetrating the insulating layer 38. A thickness of the interconnect layer 40 may be 10 μm or less, for example. The thickness of the interconnect layer 40 may be greater than 10 μm. The interconnect layer 40 includes pads located under the via interconnects 39, and an interconnect pattern located on the lower surface of the insulating layer 38. A line-and-space of the interconnect pattern located on the lower surface of the insulating layer 38 may be in a range of approximately 10 μm/10 μm to approximately 50 μm/50 μm, for example. The interconnect layer 40 includes a seed layer 40a formed on the lower surface of the insulating layer 38 and the lower surface of the electrolytic plating layer 39b, and an electrolytic plating layer 40b provided under the seed layer 40a. In the pad located under the via interconnect 39, an upper surface of the seed layer 40a is connected to the end surface of the seed layer 39a.

A material used for the seed layers 20a and 40a and a thickness of the seed layers 20a and 40a may be the same as those of the seed layers 14a and 34a, for example. A material used for the electrolytic plating layers 20b and 40b and a thickness of the electrolytic plating layers 20b and 40b may be the same as those of the electrolytic plating layers 14b and 34b, for example.

A solder resist layer, covering the interconnect layer 20, may be provided on the upper surface of the insulating layer 18. In this case, the solder resist layer includes openings partially exposing the interconnect layer 20. Portions of the interconnect layer 20 exposed through the openings in the solder resist layer can serve as pads or external connection terminals used to connect a semiconductor chip, for example.

Similarly, a solder resist layer, covering the interconnect layer 40, may be provided on a lower surface of the insulating layer 38. In this case, the solder resist layer includes openings partially exposing the interconnect layer 40. Portions of the interconnect layer 40 exposed through the openings in the solder resist layer can serve as pads or external connection terminals used to connect a semiconductor chip, for example.

[Method for Manufacturing Wiring Board]

Next, a method for manufacturing the wiring board according to the first embodiment will be described. FIG. 2A through FIG. 6 are diagrams illustrating manufacturing processes (or steps) of the wiring board according to the first embodiment. Because the wiring board 1 has a configuration in which the upper and lower sides are symmetrical with respect to the core substrate 10, the upper side and the lower side of the core substrate 10 can be formed by the same process. In this example, only the upper side of the core substrate 10 is illustrated and described. More particularly, the manufacturing processes of the wiring board 1 will be described with reference to a region of a wiring board 1 surrounded by a broken line A in FIG. 1.

The manufacturing processes for manufacturing a single wiring board will be described, but the wiring board can be manufactured by forming a large substrate having a plurality of regions where the wiring board is to be formed, and singulating the large substrate into multiple pieces corresponding to a plurality of individual wiring boards by cutting along the plurality of regions.

Figure 2A:
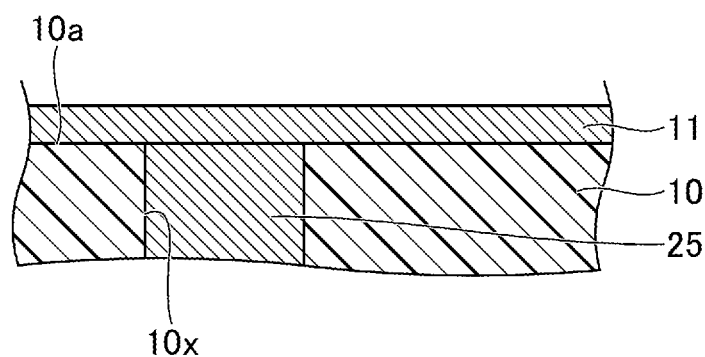
FIG. 2A, FIG. 2B, and FIG. 2C are diagrams (part 1) illustrating examples of manufacturing processes of the wiring board according to the first embodiment.

First, in the process illustrated in FIG. 2A, the core substrate 10 having the via electrodes 25 is prepared, and the interconnect layer 11 is formed on the upper surface 10a of the core substrate 10. The interconnect layer 11 may be formed by various interconnect forming methods, such as a subtractive method, a semi-additive method, or the like, for example. The interconnect layer 11 may be a copper layer, for example.

Figure 2B:
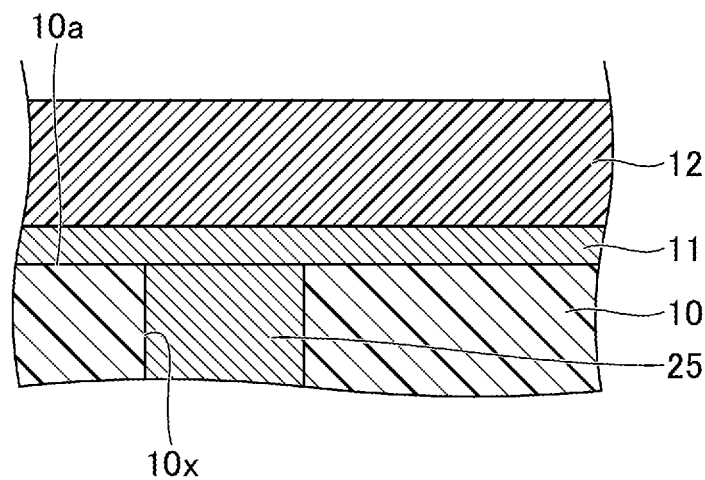

Next, in the process illustrated in FIG. 2B, the insulating layer 12 is formed on the upper surface 10a of the core substrate 10, so as to cover the interconnect layer 11. More particularly, an epoxy-based resin film or the like in a semi-cured state is laminated so as to cover the interconnect layer 11, and then cured to form the insulating layer 12. Alternatively, instead of laminating the epoxy-based resin film, a liquid or paste of the epoxy-based resin may be coated so as to cover the interconnect layer 11, and then cured to form the insulating layer 12.

Figure 2C:
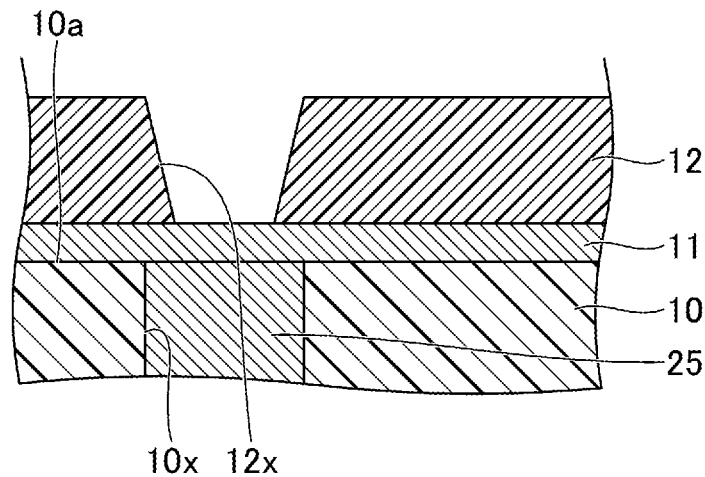

Next, in the process illustrated in FIG. 2C, the via holes 12x, penetrating the insulating layer 12 and exposing the upper surface of the interconnect layer 11, are formed in the insulating layer 12. The via holes 12x can be formed by laser beam machining using a $CO_2$ laser or the like, for example. The via hole 12x may be a cavity having an inverted truncated cone shape, and a diameter of a first opening of the cavity at one end which opens toward the insulating layer 15 is greater than a diameter of a second opening of the cavity at the other end, at a bottom surface of the cavity, formed by the upper surface of the interconnect layer 11. After forming the via holes 12x, a desmear process is preferably performed to remove resin residue adhered to the surface of the interconnect layer 11 exposed at the bottom of the via holes 12x.

Figure 3A:
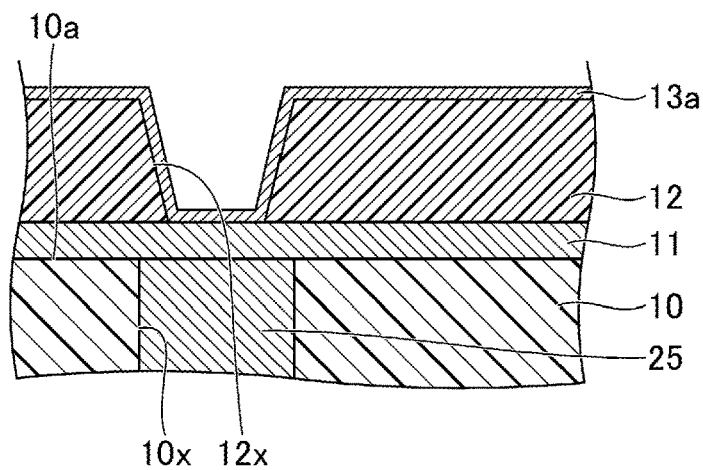
FIG. 3A, FIG. 3B, and FIG. 3C are diagrams (part 2) illustrating examples of the manufacturing processes of the wiring board according to the first embodiment.

Next, in the process illustrated in FIG. 3A, the seed layer 13a is formed to cover the upper surface of the insulating layer 12, the inner wall surface of the via holes 12x, and the upper surface of the interconnect layer 11 exposed inside the via holes 12x. The seed layer 13a may be formed by electroless plating of copper or sputtering of copper, for example. The seed layer 13a may have a thickness in a range of approximately 200 nm to approximately 400 nm, for example.

Figure 3B:
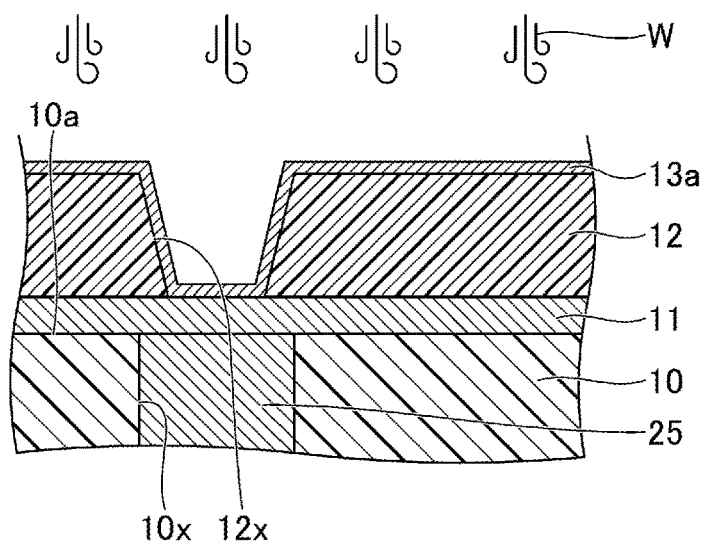

Next, in the process illustrated in FIG. 3B, the surface of the seed layer 13a is dried (substrate drying process). More particularly, the surface of the seed layer 13a can be dried by blowing a gas W, having a temperature greater than or equal to 20° C. and less than or equal to 30° C., to the seed layer 13a from an air gun connected to a compressor, for example. The gas W may be air, for example. A blowing time of the gas W may be greater than or equal to 10 seconds and less than or equal to 180 seconds, for example. By drying the surface of the seed layer 13a, a wettability of the surface of the seed layers 13a deteriorates.

Figure 3C:
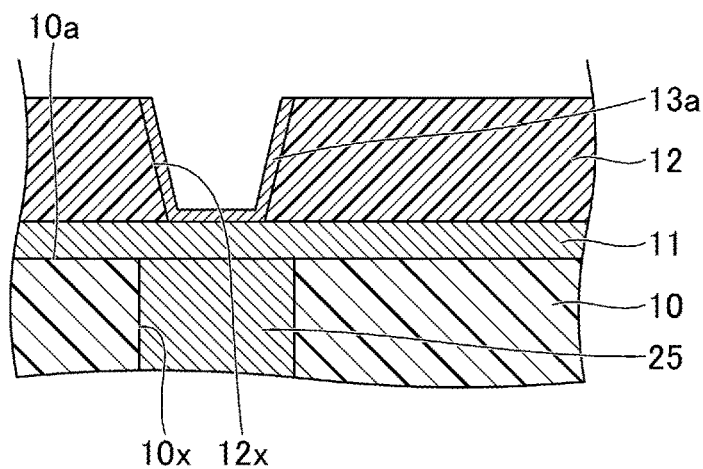

Next, in the process illustrated in FIG. 3C, a wet etching is performed on the seed layer 13a to remove the seed layer 13a located on the upper surface of the insulating layer 12, so that the seed layer 13a located inside the via holes 12x remains. More particularly, an entirety of the seed layer 13a is immersed into an etchant, for example. In this state, it is not necessary to provide an etching mask on the seed layer 13a. That is, as described above, because the wettability of the surface of the seed layer 13a deteriorates by performing the substrate drying process, the etchant used for the wet etching is less likely to enter inside the via holes 12x. As a result, the seed layer 13a located inside the via hole 12x can remain unetched, and only the seed layer 13a located on the upper surface of the insulating layer 12 can be removed.

Figure 4A:
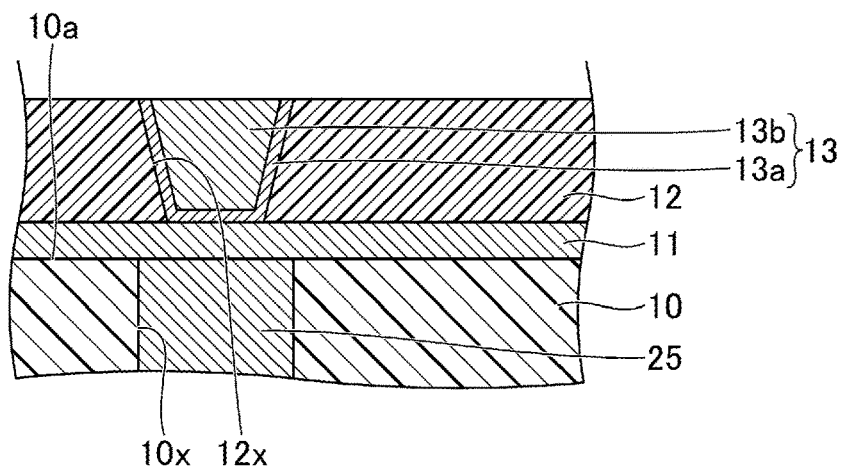
FIG. 4A, FIG. 4B, and FIG. 4C are diagrams (part 3) illustrating examples of the manufacturing processes of the wiring board according to the first embodiment.

Next, in the process illustrated in FIG. 4A, the electrolytic plating layer 13b is formed by depositing copper on the seed layer 13a located inside the via holes 12x by electrolytic plating of copper, that supplies power from the interconnect layer 11 and the seed layer 13a. In this state, plating conditions are adjusted so that the upper surface of the electrolytic plating layer 13b and the upper surface of the insulating layer 12 coincide. After forming the electrolytic plating layer 13b, the upper surface of the insulating layer 12 and the upper surface of the electrolytic plating layer 13b may be polished and planarized by a chemical mechanical polishing (CMP) or the like, as required.

The interconnect layer 11 is connected to a power supply line (not illustrated) for plating. The power for the electrolytic plating is supplied to the interconnect layer 11 and the seed layer 13a through the power supply line. In a case where the wiring board is manufactured by forming a large substrate having a plurality of regions where the wiring board is to be formed, and singulating the large substrate into multiple pieces corresponding to a plurality of individual wiring boards by cutting along the plurality of regions, the power supply line is provided between adjacent regions and connected to the interconnect layer 11. When cutting the large substrate along the plurality of regions, the power supply line is cut, and thus, the power supply line and the interconnect layer 11 are disconnected.

Figure 4B:
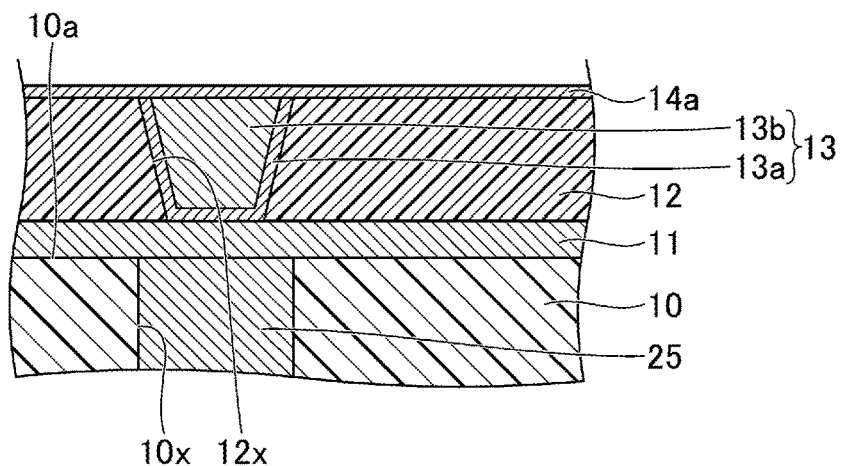

Next, in the process illustrated in FIG. 4B, the seed layer 14a is formed to cover the upper surface of the insulating layer 12 and the upper surface of the electrolytic plating layer 13b. The seed layer 14a may be formed by electroless plating of copper or sputtering of copper, for example. The seed layer 14a may have a thickness in a range of approximately 200 nm to approximately 400 nm, for example.

Figure 4C:
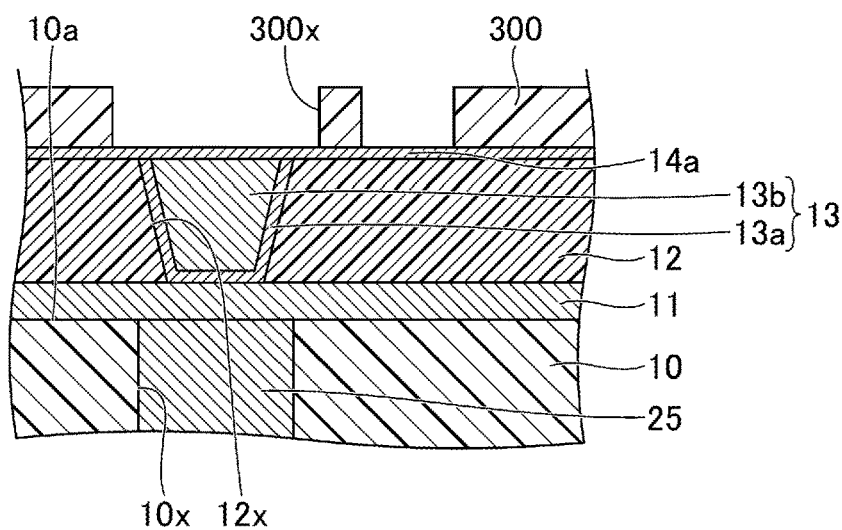

Next, in a step illustrated in FIG. 4C, a plating resist pattern 300, having an opening 300x corresponding to the shape of the interconnect layer 14, is formed on the seed layer 14a. The plating resist pattern 300 can be formed by adhering a photosensitive dry film resist on the seed layer 14a, for example. The opening 300x can be formed by exposing and developing the photosensitive dry film resist. A portion of the upper surface of the seed layer 14a is exposed inside the opening 300x.

Figure 5A:
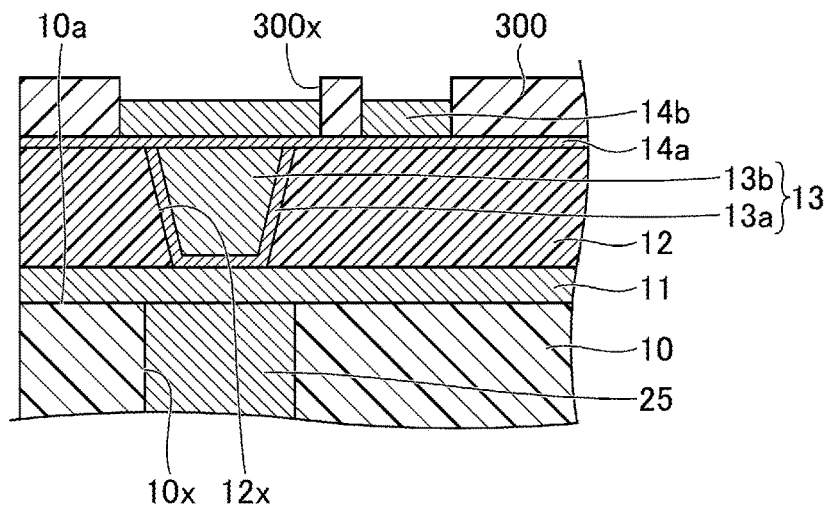
FIG. 5A, FIG. 5B, and FIG. 5C are diagrams (part 4) illustrating examples of the manufacturing processes of the wiring board according to the first embodiment.

Next, in the process illustrated in FIG. 5A, the electrolytic plating layer 14b is formed on the seed layer 14a exposed inside the opening 300x of the plating resist pattern 300, by electrolytic plating of Cu that supplies the power from the seed layer 14a. A plating bath used for forming the electrolytic plating layer 14b may include sulfuric acid and an copper sulfate pentahydrate, for example. In this case, a concentration of the sulfuric acid is preferably higher than or equal to a concentration of the copper sulfate pentahydrate. In addition, a conductivity of the plating bath is preferably 30 S/m or greater. Because such conditions improve a throwing power, it is possible to reduce a variation in the thickness of the electrolytic plating layer 14b at portions having different widths. For example, in the electrolytic plating layer 14b, it is possible to reduce the variation in the thickness of the pads located on the via interconnects 13 and the interconnect pattern located on the insulating layer 12.

Figure 5B:
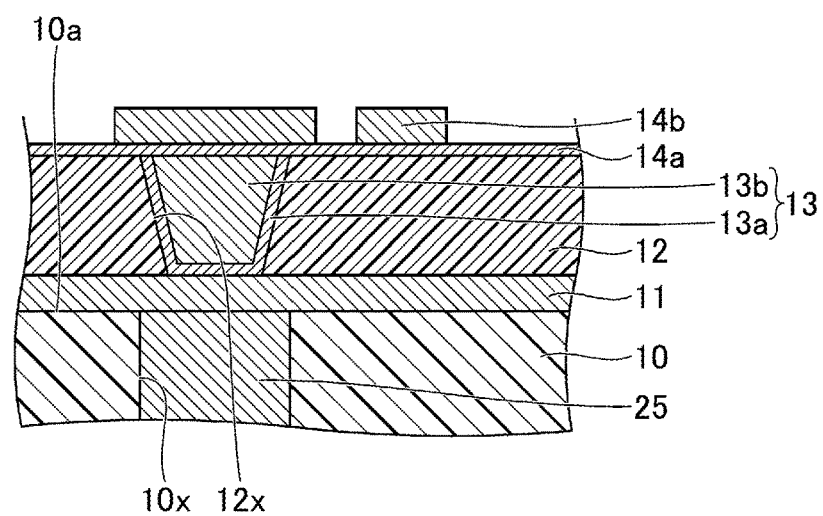

Next, in the process illustrated in FIG. 5B, the plating resist pattern 300 is removed using a plating resist stripping solution. Then, in the process illustrated in FIG. 5C, an etching is performed using the electrolytic plating layer 14b as a mask to remove the seed layer 14a exposed from the electrolytic plating layer 14b, thereby forming the interconnect layer 14.

Figure 5C:
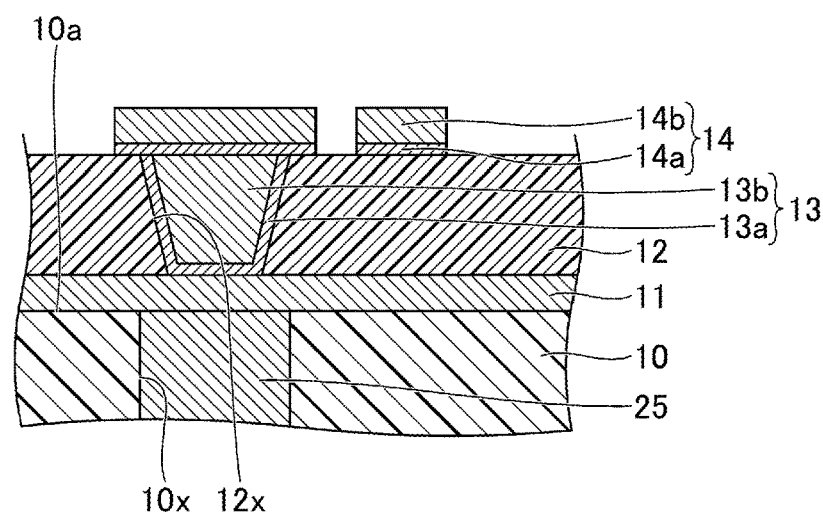
Figure 6:
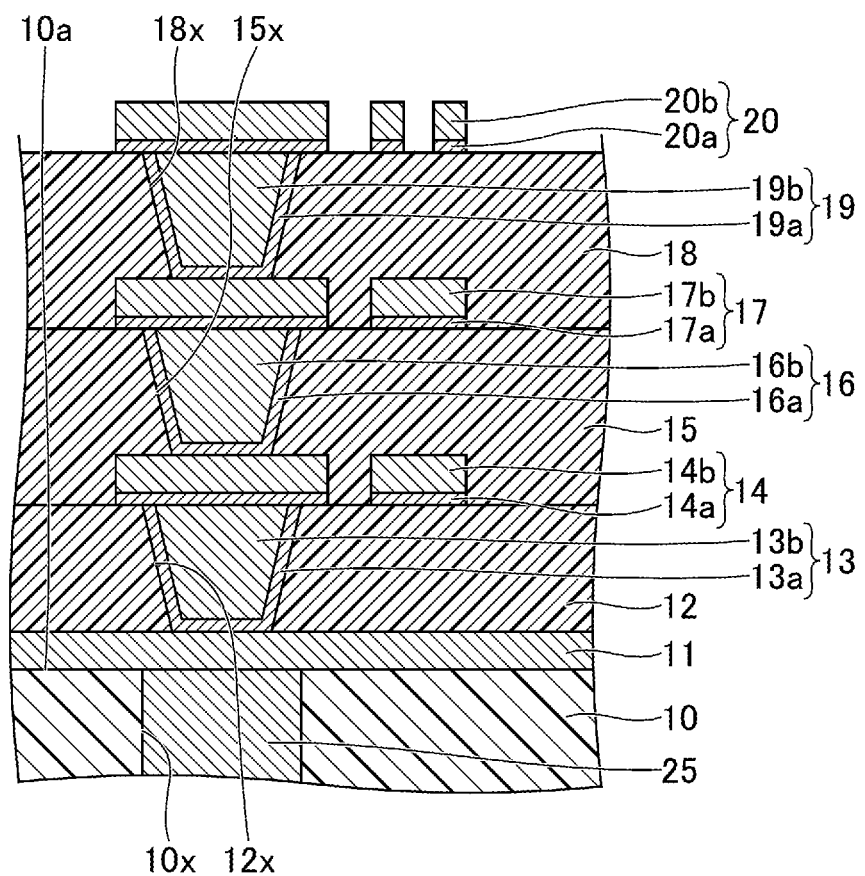
FIG. 6 is a diagram (part 5) illustrating an example of the manufacturing process of the wiring board according to the first embodiment.

Next, in a process illustrated in FIG. 6, the processes of FIG. 2B through FIG. 5C are repeated a required number of times, so that the insulating layer 15, the via interconnect 16, the interconnect layer 17, the insulating layer 18, the via interconnect 19, and the interconnect layer 20 are laminated on the structure illustrated in FIG. 5C. The wiring board 1 is completed by performing the processes described above.

As described above, in the conventional method, the via hole cannot be filled unless the interconnect layer formed on the upper surface of the insulating layer has a thickness greater than or equal to a predetermined value. However, in the wiring board 1 described above, the via interconnect and the interconnect layer formed thereon are separate bodies. For this reason, the thickness of the interconnect layer can be designed independently, without taking into consideration the formation of the via interconnects (filling of the via holes). That is, by adopting the configuration of the wiring board 1 described above, it is possible to improve the design freedom of the thickness of the interconnect layer.

Further, because the via interconnect and the interconnect layer formed thereon are separate bodies in the wiring board 1, plating baths under different conditions can be used in the process of forming the via interconnect and the process of forming the interconnect layer. For example, the plating bath used in the process of forming the via interconnect can be selected by placing more importance on a filling property than on the throwing power, so that the via holes can easily be filled. On the other hand, the plating bath used in the process of forming the interconnect layer can be selected by placing more importance on the throwing power than on the filling property, so that a variation in thickness with respect to the width of the interconnect layer can be reduced. That is, in general, in the case where the interconnect layer is formed by electrolytic plating, the interconnect layer tends to become thin at a narrow portion thereof and become thick at a wide portion thereof. However, in the wiring board 1, a thickness variation between the narrow portion and the wide portion of the interconnect layer can be reduced when compared to the conventional case. The throwing power and the filling property can be adjusted by varying concentrations of copper sulfate and sulfuric acid in the plating bath, or changing a type of additive to be added for the purpose of forming the via interconnect or for the purpose of achieving high throwing power, for example.

During the manufacturing processes of the wiring board 1, it is unnecessary to perform a polishing process or the like on the surface of the interconnect layer in order to make the thickness of the interconnect layer uniform. Even if such a polishing process is not performed, it is possible to obtain an interconnect layer having an excellent film thickness ratio.

As will be described later, the film thickness ratio can be defined as TIP/TP×100, where TIP denotes the thickness of the interconnect pattern, and TP denotes the thickness of the pad.

Figure 7A:
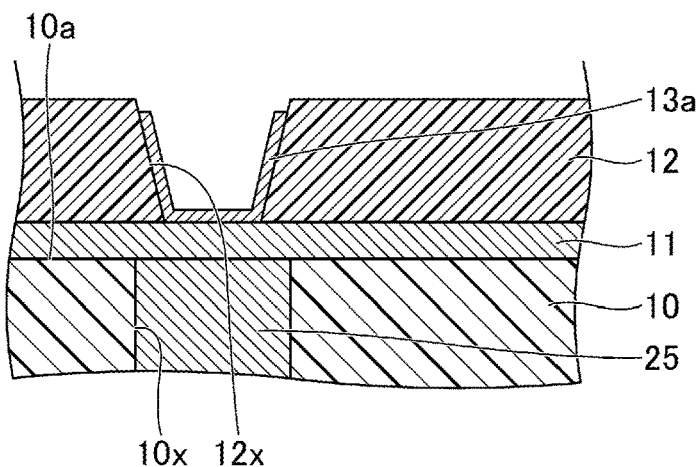
FIG. 7A, FIG. 7B, and FIG. 7C are diagrams illustrating other examples of the manufacturing processes of the wiring board according to the first embodiment.
Figure 7B:
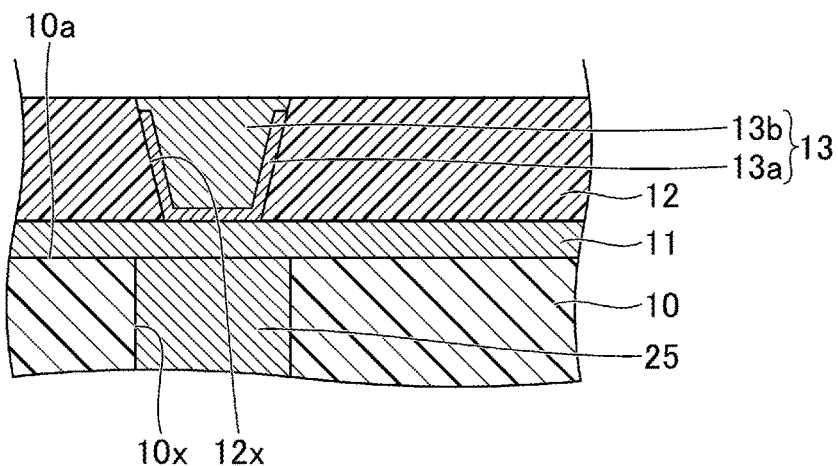
Figure 7C:
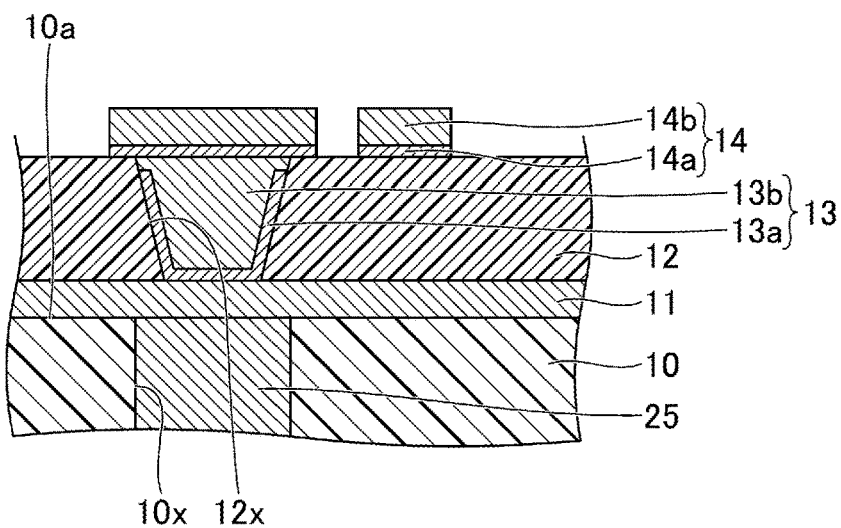

FIG. 7A through FIG. 7C are diagrams illustrating other examples of the manufacturing processes of the wiring board according to the first embodiment. As illustrated in FIG. 7A, during the wet etching in the process of FIG. 3C, the end surface of the seed layer 13a may sag from the upper surface of the insulating layer 12 into the via hole 12x. In this case, the inner wall surface of the via hole 12x becomes exposed in a vicinity of the opening of the via hole 12x.

In this case, as illustrated in FIG. 7B, during the electrolytic plating in the process of FIG. 4A, the end surface of the seed layer 13a is covered with the electrolytic plating layer 13b. Hence, even in this case, it is possible to sufficiently fill the inside of the via hole 12x with the electrolytic plating layer 13b.

Accordingly, as illustrated in FIG. 7C, it is possible to satisfactorily form the seed layer 14a on the upper surface of the insulating layer 12 and on the upper surface of the electrolytic plating layer 13b, and form the electrolytic plating layer 14b on the upper surface of the seed layer 14a.

The present invention is applicable to a wiring board having two or more interconnect layers, wherein adjacent interconnect layers are electrically connected through via interconnects penetrating an insulating layer interposed between the adjacent interconnect layers. For example, the present invention is not limited to the wiring board having the core substrate, such as the wiring board 1 illustrated in FIG. 1, and is also applicable to a coreless wiring board, such as a wiring board 1A illustrated in FIG. 8. The wiring board 1A illustrated in FIG. 8 has the same layer structure as a portion of the wiring board 1 laminated on the upper surface 10a of the core substrate 10.

Figure 8:
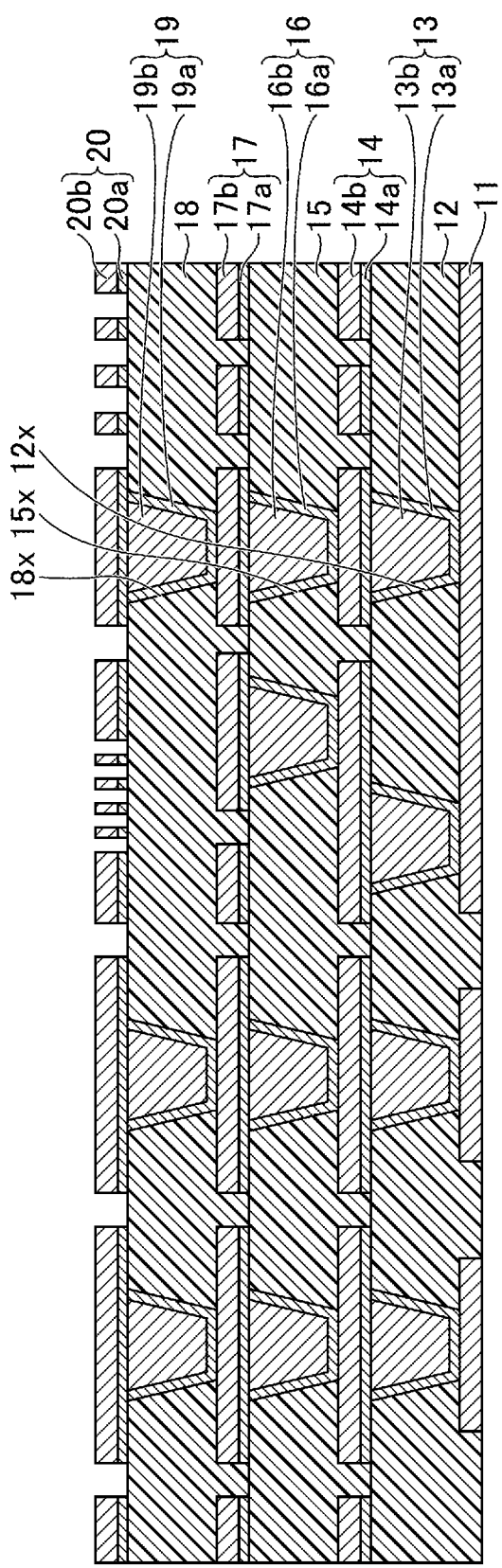
FIG. 8 is a diagram illustrating an example of the wiring board according to a modification of the first embodiment.

Similar to the wiring board 1 illustrated in FIG. 1, the wiring board 1A illustrated in FIG. 8 may include a solder resist layer, covering the interconnect layer 20, provided on the upper surface of the insulating layer 18. Further, the wiring board 1A may include a solder resist layer, covering the interconnect layer 11, provided on the lower surface of the insulating layer 12.

Next, exemplary implementations and comparative examples will be described in the following, however, the present invention is not limited to such exemplary implementations.

Exemplary Implementation EI1 and Comparative Example CE1

As described above with reference to FIG. 3B and FIG. 3C, during the manufacturing processes of the wiring board according to the first embodiment, after the seed layer is formed on the upper surface of the insulating layer and inside the via holes, the substrate drying process is performed, and only the seed layer formed on the upper surface of the insulating layer is removed by the subsequent etching process. In an exemplary implementation EI1, experiments were conducted to confirm the effects of the substrate drying process.

More particularly, in the exemplary implementation EI1, the processes of FIG. 2A through FIG. 3C were performed. In addition, in a comparative example CE1, the processes of FIG. 2A through FIG. 3C were performed in the same manner as in the exemplary implementation EI1, except that the substrate drying process of FIG. 3B was not performed. Then, the wiring boards manufactured according to the exemplary implementation EI1 and the comparative example CE1 were subjected to a backscattered electron image observation (confirmation of contrast difference) using a scanning electron microscope (SEM). The experiments were repeated three times for each of the exemplary implementation EI1 and the comparative example CE1 to confirm the reproducibility. In addition, the substrate drying process was performed by blowing air at room temperature onto the entire surface of the seed layer for 60 seconds from an air gun connected to a compressor.

In a case where the seed layer on the upper surface of the insulating layer is removed and the seed layer is present inside the via hole during the process of FIG. 3C, the contrast difference depending on an average atomic number can be confirmed between carbon on the upper surface of the insulating layer and copper inside the via hole by the backscattered electron image observation. On the other hand, in a case where the seed layer on the upper surface of the insulating layer is removed and the seed layer inside the via hole is also removed during the process of FIG. 3C, the contrast difference depending on the average atomic number cannot be confirmed between the upper surface of the insulating layer and the inside of the via hole by the backscattered electron image observation. The results are illustrated in Table 1.

TABLE 1

| | Contrast Difference Between Upper Surface of Insulating Layer & Inside Via Hole | | |
|---|---|---|---|
| | First Observation | Second Observation | Third Observation |
| With Substrate Drying Process (EI1) | Contrast Difference Present | Contrast Difference Present | Contrast Difference Present |
| Without Substrate Drying Process (CE1) | No Contrast Difference | No Contrast Difference | No Contrast Difference |

As illustrated in Table 1, in the exemplary implementation EI1, a contrast difference was observed for each of the first, second, and third observations. On the other hand, in the comparative example CE1, no contrast difference was observed for each of the first, second, and third observations. That is, it was confirmed that, by providing the substrate drying process before etching the seed layer, it is possible to remove only the seed layer on the upper surface of the insulating layer, and maintain the seed layer inside the via hole. Further, it was confirmed that reproducibility is obtainable repeatedly.

It may be regarded that the observation results of the exemplary implementation EI1 were obtained because the wettability of the surface of the seed layer deteriorated due to the substrate drying process, and it became difficult for the etchant to enter inside the via holes during the etching process. On the other hand, it may be regarded that the observation results of comparative example CE1 for which the substrate drying process was not performed were obtained because the wettability of the surface of the seed layer was good and the etchant entered inside the via holes during the etching process.

In the case of the exemplary implementation EI1, the wiring board subjected to the processes up to the process of FIG. 3C was subsequently subjected to the process of FIG. 4A. As a result, no copper was deposited on the upper surface of the insulating layer, and it was possible to fill the via holes with the copper. Accordingly, it was confirmed that only the seed layer on the upper surface of the insulating layer is removed during the process of FIG. 3C, and that the seed layer inside the via holes remains.

Comparative Examples CE2 & CE3, and Exemplary Implementation EI2

In a comparative example CE2, the wiring board was manufactured according to a process employing a typical semi-additive method. The method for manufacturing the wiring board according to the comparative example CE2 does not include the processes described with reference to FIG. 3B through FIG. 6, among the processes of FIG. 2A through FIG. 6 included in the method for manufacturing the wiring board according to the first embodiment. That is, in the method for manufacturing the wiring board according to the comparative example CE2, after the process of FIG. 3A, a plating resist pattern having an opening corresponding to the interconnect layer is formed on the insulating layer, and the via interconnect, the pad formed on the via interconnect, and the interconnect pattern are formed in the same electrolytic copper plating process. Then, after stripping plating resist pattern, the unnecessary seed layer is removed.

In the wiring board according to the comparative example CE2, three kinds of via holes having opening diameters of 55 μm, 65 μm, and 75 μm at the upper surface side of the insulating layer, respectively, were formed. In the wiring board according to the comparative example CE2, the interconnect pattern was a linear interconnect pattern with a line-and-space (L/S) of 16 μm/16 μm. In the wiring board according to the comparative example CE2, the thickness of the pads formed on the three kinds of via holes having the different opening diameters, and the thickness of the interconnect pattern were measured using a laser microscope. The results are illustrated in Table 2.

TABLE 2

| Comparative | Via Opening Diameter (μm) | | | Interconnect Pattern |
|---|---|---|---|---|
| Example CE2 | 55 | 65 | 75 | L/S = 16 μm/16 μm |
| Thickness of Pad on Via Hole | | ≈22 μm | | — |
| Thickness of Interconnect Pattern | | — | | ≈18 μm |

As illustrated in Table 2, the thicknesses of the pads on the via holes having the opening diameters of 55 μm, 65 μm, and 75 μm were approximately 22 μm, and there was no significant difference among the thicknesses of the pads on the via holes having the different opening diameters. On the other hand, the thickness of the interconnect pattern was approximately 18 μm, which is approximately 4 μm thinner than the pads on the via holes. The film thickness ratio computed from these results was approximately 82%. The film thickness ratio was defined as TIP/TP×100, where TIP denotes the thickness of the interconnect pattern, and TP denotes the thickness of the pad. The film thickness ratio is preferably as close to 100 as possible.

Comparative Example CE3

In a comparative example CE3, a wiring board was manufactured by a manufacturing method identical to the manufacturing method of the comparative example CE2. In the comparative example CE3, via holes having an opening diameter of 60 μm at the upper surface of the insulating layer and a depth of 32.5 μm were formed, and a filled extent of the via holes was observed while varying the thickness of the pads formed on the via holes. The observation was performed using a SEM photograph of a cross section. The results are illustrated in Table 3. In Table 3, a case where the via holes were filled to a height of the upper surface of the insulating layer was evaluated as "satisfactory", and a case where the via holes were not filled to the height of the upper surface of the insulating layer was evaluated as "insufficient".

TABLE 3

| Comparative Example CE3 | Opening Diameter/Depth of Via Hole 60 µm/32.5 µm | | | | |
|---|---|---|---|---|---|
| Thickness of Pad on Via Hole | ≈5 µm | ≈7 µm | ≈9 µm | ≈11 µm | ≈17 µm |
| Filled Extent of Via Hole | Insufficient | Insufficient | Insufficient | Satisfactory | Satisfactory |

As illustrated in Table 3, it was found that the filled extent of the via holes becomes "satisfactory" when the electrolytic copper plating process is performed so that the thickness of the pads on the via holes is approximately 11 µm. In other words, it was found that if the thickness of the pads on the via holes is thinner than approximately 11 µm, the via holes cannot be filled satisfactorily. That is, in the method for manufacturing the wiring board according to the comparative example CE3, it is not possible to manufacture a wiring board in which the pads and interconnect are thin, and the design freedom of the interconnect pattern is low.

Exemplary Implementation EI2

In an exemplary implementation EI2, the processes of FIG. 2A through FIG. 4C were performed, and then, in the processes of FIG. 5A through FIG. 5C, the interconnect layer 14 illustrated in FIG. 5C was formed under different plating conditions. The manufactured wiring board is referred to as a wiring board (a) for the sake of convenience. In the interconnect layer 14 of the wiring board (a), the diameter of the pads on the via holes was 80 µm, and the line-and-space (L/S) of the interconnect pattern was 10 µm/10 µm. Further, the processes of FIG. 2A through FIG. 4C were performed, and then, in the processes of FIG. 5A through FIG. 5C, the interconnect layer 14 illustrated in FIG. 5C was formed under different plating conditions. The manufactured wiring board is referred to as a wiring board (b) for the sake of convenience. In the interconnect layer 14 of the wiring board (b), the diameter of the pads on the via holes was 120 µm, and the line-and-space (L/S) of the interconnect pattern was 16 µm/16 µm.

In the wiring board (a) and the wiring board (b), the conditions of the electrolytic copper plating for forming the pads and the interconnect patterns of the interconnect layer 14 used five kinds of different ratios of a concentration of cupric sulfate pentahydrate and a concentration of sulfuric acid illustrated in Table 4, where a sum total of the concentration of cupric sulfate pentahydrate and the concentration of sulfuric acid in the plating bath is 300 g/L.

TABLE 4

| Exemplary Implementation EI2 | | |
|---|---|---|
| | Copper Sulfate Pentahydrate Concentration [g/L] | Sulfuric Acid Concentration [g/L] |
| 1 | 100 | 200 |
| 2 | 130 | 170 |
| 3 | 150 | 150 |
| 4 | 200 | 100 |
| 5 | 250 | 50 |

Figure 9:
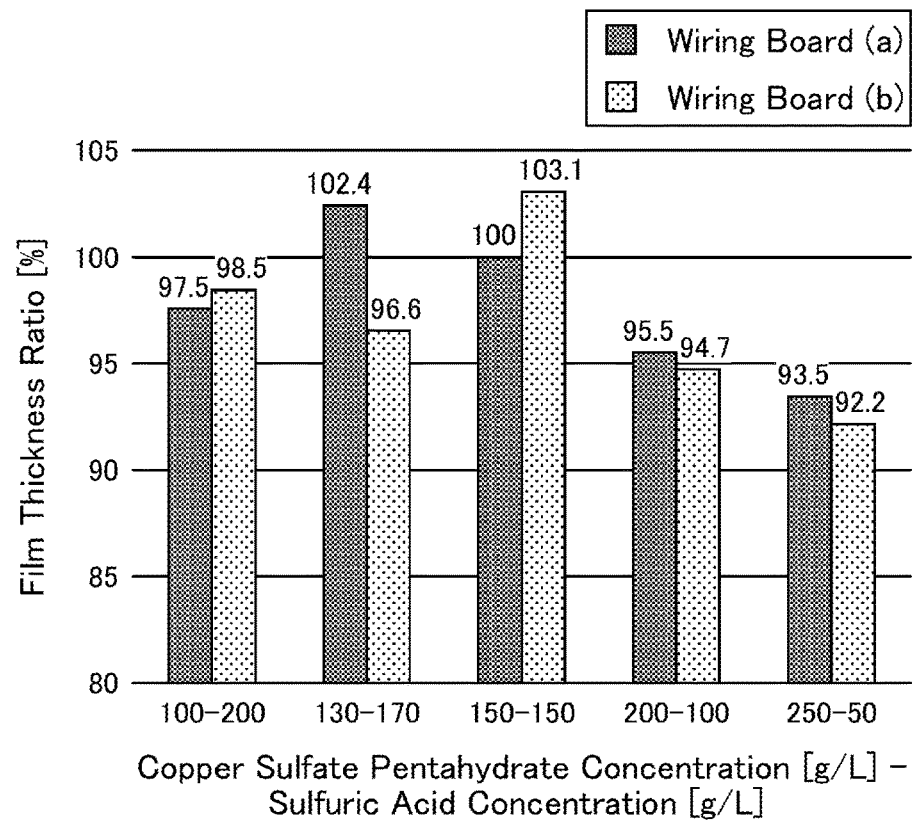
FIG. 9 is a diagram illustrating an example of a relationship between a plating bath and a film thickness ratio.

Results of the film thickness ratios computed for the wiring board (a) and the wiring board (b) that were manufactured are summarized in FIG. 9. As illustrated in FIG. 9, in both of the wiring board (a) and the wiring board (b), in cases where the copper sulfate pentahydrate concentration-sulfuric acid concentration is 200-100 and 250-50, the film thickness ratio was greater than or equal to 90% and found to be satisfactory. Further, in cases where the copper sulfate pentahydrate concentration-sulfuric acid concentration is 100-200, 130-170, and 150-150, the film thickness ratio was greater than or equal to 95% and found to be even more satisfactory. Thus, by using the plating bath in which the concentration of copper sulfate pentahydrate is decreased and the concentration of sulfuric acid is increased, it is possible to improve the throwing power, and reduce the thickness variation of the pads and the interconnect layer. The copper sulfate pentahydrate concentration-sulfuric acid concentration may also be referred to as "the copper sulfate pentahydrate concentration versus sulfuric acid concentration" or "the [copper sulfate pentahydrate concentration]:[sulfuric acid concentration]".

Figure 10:
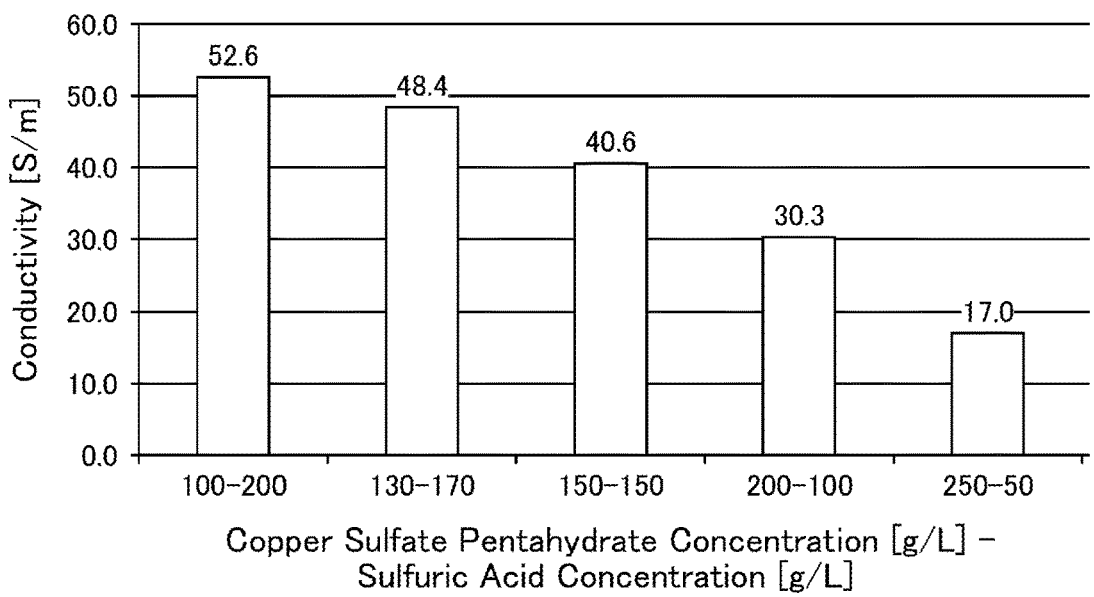
FIG. 10 is a diagram illustrating an example of a relationship between the plating path and a conductivity.
Figure 11:
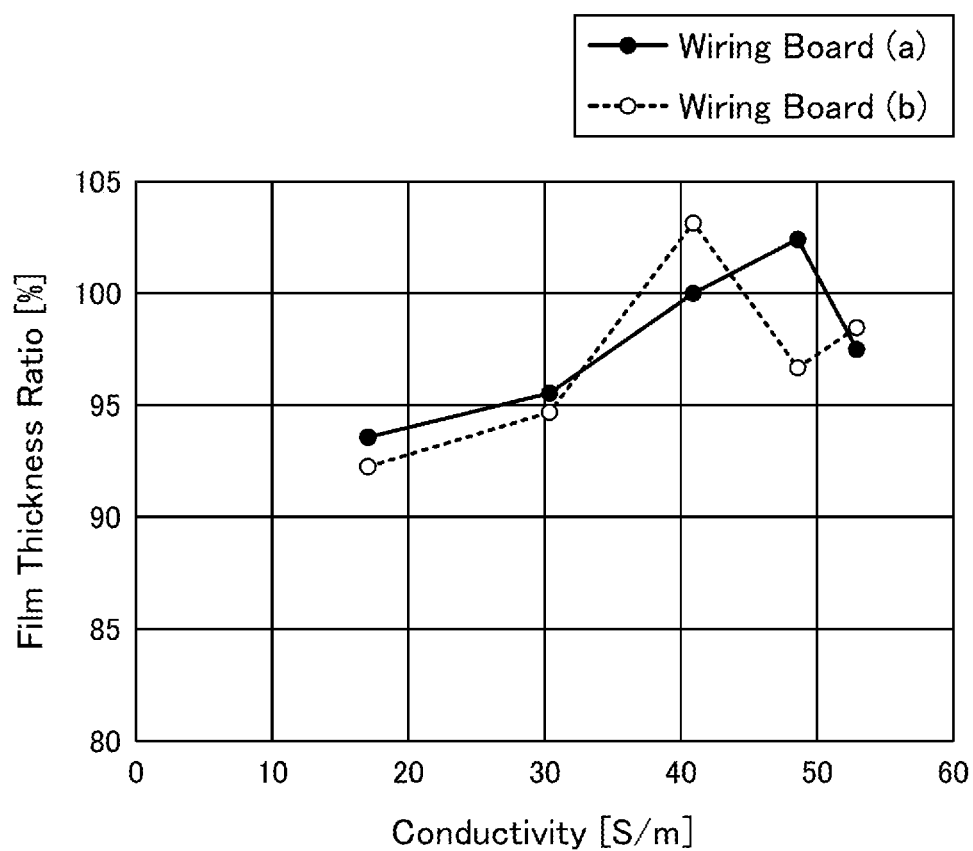
FIG. 11 is a diagram illustrating an example of a relationship between the conductivity and the film thickness ratio.

Next, a conductivity of the plating bath was measured under each of the conditions illustrated in Table 4. Results of the measurement are illustrated in FIG. 10. Further, a relationship between the conductivity and the film thickness ratio was obtained from the results of FIG. 9 and the results of FIG. 10. The obtained relationship between the conductivity and the film thickness ratio results is illustrated in FIG. 11. From FIG. 11, although a film thickness ratio greater than or equal to 90% can be obtained regardless of the conductivity of the plating bath, it may be regarded that the film thickness ratio tends to improve when the conductivity of the plating bath is increased. More particularly, in a case where the conductivity is greater than or equal to 30 S/m, the film thickness ratio becomes greater than or equal to approximately 95%. Further, in a case where the conductivity is greater than or equal to 40 S/m, the thickness ratio can further be improved.

As described above, in the comparative example CE2, the film thickness ratio is approximately 82%. In contrast, in the exemplary implementation EI2, the film thickness ratio greater than or equal to 90% was obtained. In the comparative example CE2, the via interconnect, the pad, and the interconnect pattern are formed by a single plating process, and thus, the conditions of the plating bath cannot be individually selected for the via interconnect, the pad, and the interconnect pattern. On the other hand, in the exemplary implementation EI2, the plating process for forming the via interconnect and the plating process for forming the pad and the interconnect pattern are separate processes. For this reason, it is possible to select plating baths suitable for the plating process for forming the via interconnect, and the plating process for forming the pad and the interconnect pattern, respectively. As a result, when forming the pad and the interconnect pattern, the effect of reducing the film thickness variation can be obtained by selecting a plating solution having an excellent throwing power as illustrated in Table 4. In the exemplary implementation EI2, because the plating bath for forming the via interconnect can be selected by placing importance on the filling property rather than the throwing power, the via hole can easily be filled.

As illustrated in the comparative example CE3, when conventionally filling the via hole, the thickness of the pad and the interconnect pattern need to be greater than or equal to a predetermined thickness. In contrast, in the exemplary implementation EI2, because the plating for forming the via interconnect and the plating for forming the pad and the interconnect pattern are performed by separate processes, the pad and the interconnect pattern can be designed to have an arbitrary thickness without taking into consideration the filling of the via hole, and the design freedom can be improved. In the exemplary implementation EI2, the thicknesses of the pad and the interconnect pattern may be set in a range greater than or equal to 1 µm and less than or equal to 10 µm, for example.

Accordingly to each of the embodiments described above, it is possible to provide a wiring board that can improve a design freedom of a thickness of an interconnect layer.

Various aspects of the subject-matter described herein may be set out non-exhaustively in the following numbered clauses:

1. A method for manufacturing a wiring board, comprising:
    forming an insulating layer covering a first interconnect layer;
    forming a via hole penetrating the insulating layer and exposing an upper surface of the first interconnect layer;
    forming a first seed layer covering an upper surface of the insulating layer, an inner wall surface of the via hole, and the upper surface of the first interconnect layer exposed inside the via hole;
    drying a surface of the first seed layer;
    removing the first seed layer located on the upper surface of the insulating layer by a wet etching of the first seed layer, so as to maintain the first seed layer located inside the via hole;
    forming a first electrolytic plating layer on the first seed layer located inside the via hole;
    forming a second seed layer on the upper surface of the insulating layer and an upper surface of the first electrolytic plating layer; and
    forming a second electrolytic plating layer on the second seed layer.

2. The method for manufacturing the wiring board according to clause 1, wherein the removing the first seed layer, during the wet etching, immerses an entirety of the first seed layer into an etchant without providing an etching mask on the first seed layer.

3. The method for manufacturing the wiring board according to clause 1, wherein the drying blows a gas, having a temperature greater than or equal to 20° C. and less than or equal to 30° C., to the first seed layer.

4. The method for manufacturing the wiring board according to any one of clauses 1 to 3, wherein
    the second electrolytic plating layer is formed of copper,
    a plating bath used for forming the second electrolytic plating layer includes sulfuric acid and copper sulfate pentahydrate, and
    a concentration of the sulfuric acid is greater than or equal to a concentration of the copper sulfate pentahydrate.

5. The method for manufacturing the wiring board according to any one of clauses 1 to 3, wherein
    the second electrolytic plating layer is formed of copper, and
    a plating bath used for forming the second electrolytic plating layer includes sulfuric acid and copper sulfate pentahydrate, and
    the plating bath has a conductivity greater than or equal to 30 S/m.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    a first interconnect layer;
    an insulating layer covering the insulating layer;
    a via interconnect penetrating the insulating layer; and
    a second interconnect layer provided on an upper surface of the insulating layer and electrically connected to the first interconnect layer through the via interconnect, wherein:
    the via interconnect includes
        a first seed layer that covers an inner wall surface of a via hole penetrating the insulating layer, and an upper surface of the first interconnect layer exposed inside the via hole, and
        a first electrolytic plating layer provided on the first seed layer, and
    the second interconnect layer includes
        a second seed layer provided on the upper surface of the insulating layer and on an upper surface of the first electrolytic plating layer, and
        a second electrolytic plating layer provided on the second seed layer, and
    the second seed layer of the second interconnect layer simultaneously covers the upper surface of the insulating layer and an entirety of the upper surface of the first electrolytic plating layer exposed from the insulating layer.

2. The wiring board as claimed in claim 1, wherein:
    an end surface of the first seed layer is exposed at the upper surface of the insulating layer, and
    the end surface of the first seed layer and a lower surface of the second seed layer are connected.

3. The wiring board as claimed in claim 1, wherein the second interconnect layer includes a pad located on the via interconnect, and an interconnect pattern located on the upper surface of the insulating layer.

4. The wiring board as claimed in claim 1, wherein the upper surface of the insulating layer and the upper surface of the first electrolytic plating layer coincide.

5. The wiring board as claimed in claim 1, wherein the second interconnect layer has a thickness of 10 µm or less.

6. The wiring board as claimed in claim 1, wherein an end surface of the first seed layer, the upper surface of the first electrolytic plating layer, and the upper surface of the insulating layer coincide.

7. The wiring board as claimed in claim 1, wherein:
    an end surface of the first seed layer sags from the upper surface of the insulating layer into the via hole, and the end surface of the first seed layer is covered with the first electrolytic plating layer.

8. The wiring board as claimed in claim 1, wherein the first seed layer of the via interconnect continuously covers an inner wall surface of the via hole and the upper surface of the first interconnect layer exposed inside the via hole, to cover an entirety of the upper surface of the first interconnect layer exposed inside the via hole.

9. The wiring board as claimed in claim 1, wherein the second seed layer of the second interconnect layer simultaneously covers the upper surface of the insulating layer, an entirety of an end surface of the first seed layer exposed from the insulating layer, and an entirety of the upper surface of the first electrolytic plating layer exposed from the insulating layer.

* * * * *